United States Patent [19]

Le et al.

[11] Patent Number: 5,908,316

[45] Date of Patent: Jun. 1, 1999

[54] METHOD OF PASSIVATING A SEMICONDUCTOR SUBSTRATE

[75] Inventors: Hiep M. Le, Phoenix; Lonne L. Mays, Gilbert; Albert E. Tavares, Glendale, all of Ariz.

[73] Assignee: Motorola, Inc., Schaumburg, Ill.

[21] Appl. No.: 08/573,843

[22] Filed: Dec. 18, 1995

[51] Int. Cl.$^6$ .................. H61L 21/465; H01L 29/06; H01L 29/90
[52] U.S. Cl. ................. 438/362; 438/768; 438/770
[58] Field of Search .................... 437/228; 438/362, 438/768, 770, FOR 123

[56] References Cited

U.S. PATENT DOCUMENTS

| | | | |
|---|---|---|---|
| 3,898,141 | 8/1975 | Ermanis et al. | 204/129.43 |
| 4,373,255 | 2/1983 | Goronkin | 29/580 |
| 5,405,492 | 4/1995 | Moslehi | 156/643 |

*Primary Examiner*—John Kight
*Assistant Examiner*—Raymond Covington
*Attorney, Agent, or Firm*—George C. Chen

[57] ABSTRACT

A method of passivating a semiconductor substrate includes singulating (13) a semiconductor substrate (23) from a semiconductor wafer, coupling (14) a heatsink (21) to the semiconductor substrate (23), etching (15) the semiconductor substrate (23) in a chamber of an etch tool, and passivating (17) the semiconductor substrate (23) with an oxide layer (31). The semiconductor substrate (23) is kept in the chamber of the etch tool from the etching (15) step through the passivating (17) step. The etching (15) of the semiconductor substrate (23) does not substantially etch the heatsink (21), and the passivating (17) of the semiconductor substrate (23) does not substantially passivate the heatsink (21).

34 Claims, 3 Drawing Sheets

20

METHOD OF PASSIVATING A SEMICONDUCTOR SUBSTRATE

BACKGROUND OF THE INVENTION

This invention relates, in general, to semiconductors, and more particularly, to passivating semiconductor substrates.

Diodes used in high power or high voltage applications are often manufactured with an open junction. The diode is fabricated in a semiconductor substrate where the p-n junction of the diode is open or is exposed along a surface of the semiconductor substrate. Accordingly, the diode is known in the art as an open junction diode.

Individual open junction diodes are singulated from a semiconductor wafer by a conventional sawing or mechanical dicing technique. Afterwards, the open junction diodes are subjected to a wet caustic chemical etch to remove the structural damage created by the mechanical singulation process. Then, the open junction diodes are assembled and packaged. However, the open junction diodes are often damaged by physical handling or contaminated by particulates or humidity after the caustic chemical etch and before the packaging process because the junctions of the diodes are open or exposed to ambient environment that may contain contaminants.

Accordingly, a need exists for a method of passivating an open junction diode or any semiconductor substrate. The method should be cost-effective, simple, and compatible with existing semiconductor process flows.

DETAILED DESCRIPTION OF THE DRAWINGS

Figure 1:
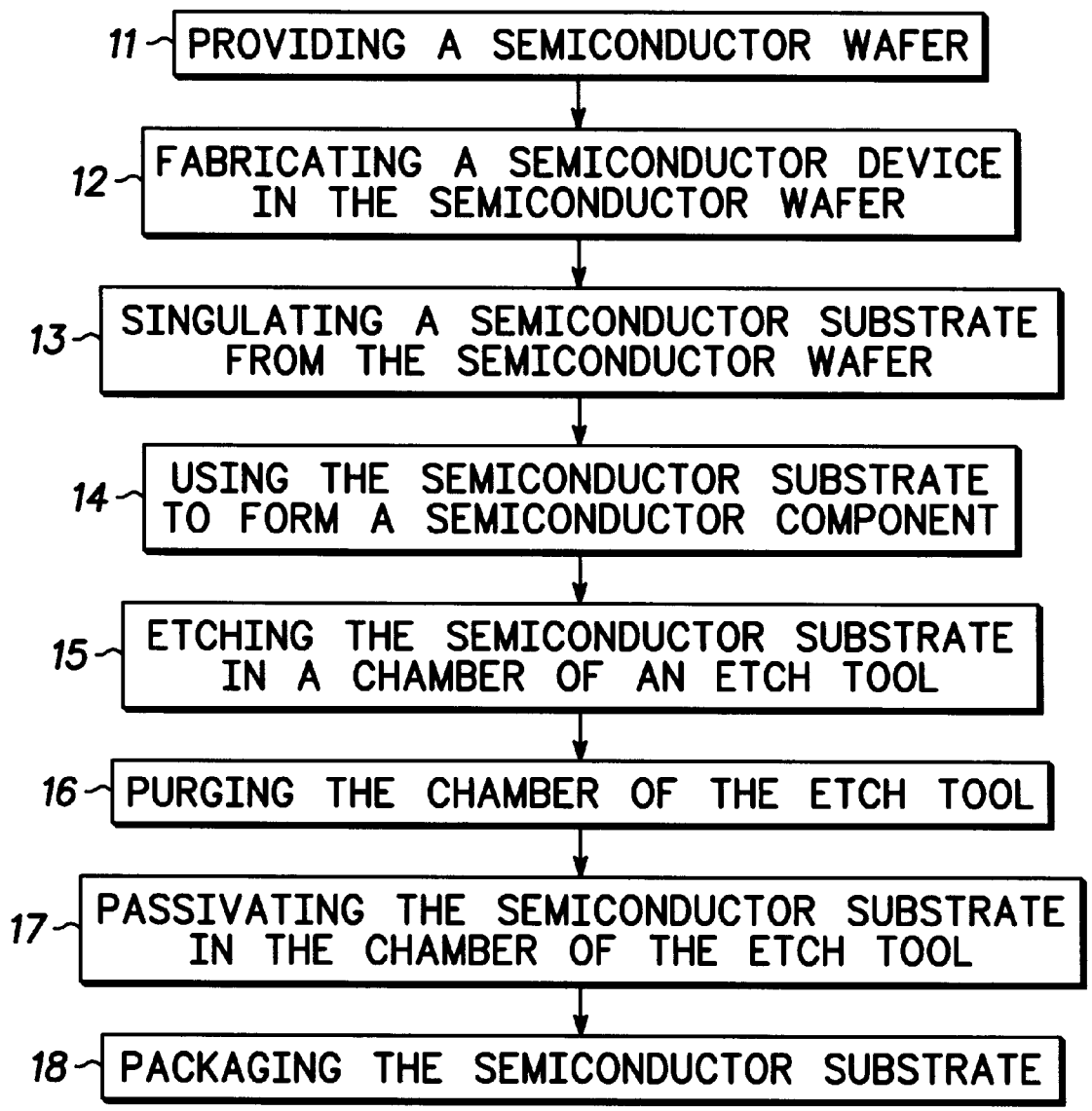
FIG. 1 outlines an embodiment of a method of passivating a semiconductor substrate in accordance with the present invention.

Turning to the figures for a more detailed description, FIG. 1 outlines an embodiment of a method of passivating a semiconductor substrate in accordance with the present invention. A Process or method 10 begins with providing a semiconductor wafer or semiconductor substrate, as identified in a step 11 of FIG. 1. The semiconductor wafer of step 11 is preferably comprised of a semiconductor such as, for example, silicon, germanium, or gallium arsenide.

Method 10 continues by fabricating a semiconductor device in the semiconductor wafer, as indicated in a step 12 of FIG. 1. The semiconductor device of step 12 is fabricated using conventional processing techniques such as, for example, diffusion. Preferably, a semiconductor diode or a vertical p-n junction is formed in the semiconductor wafer.

Referring to the next step of method 10, a step 13 singulates or separates a semiconductor substrate from the semiconductor wafer. The singulation process in step 13 preferably includes a sawing or dicing technique as known in the art.

Figure 2:
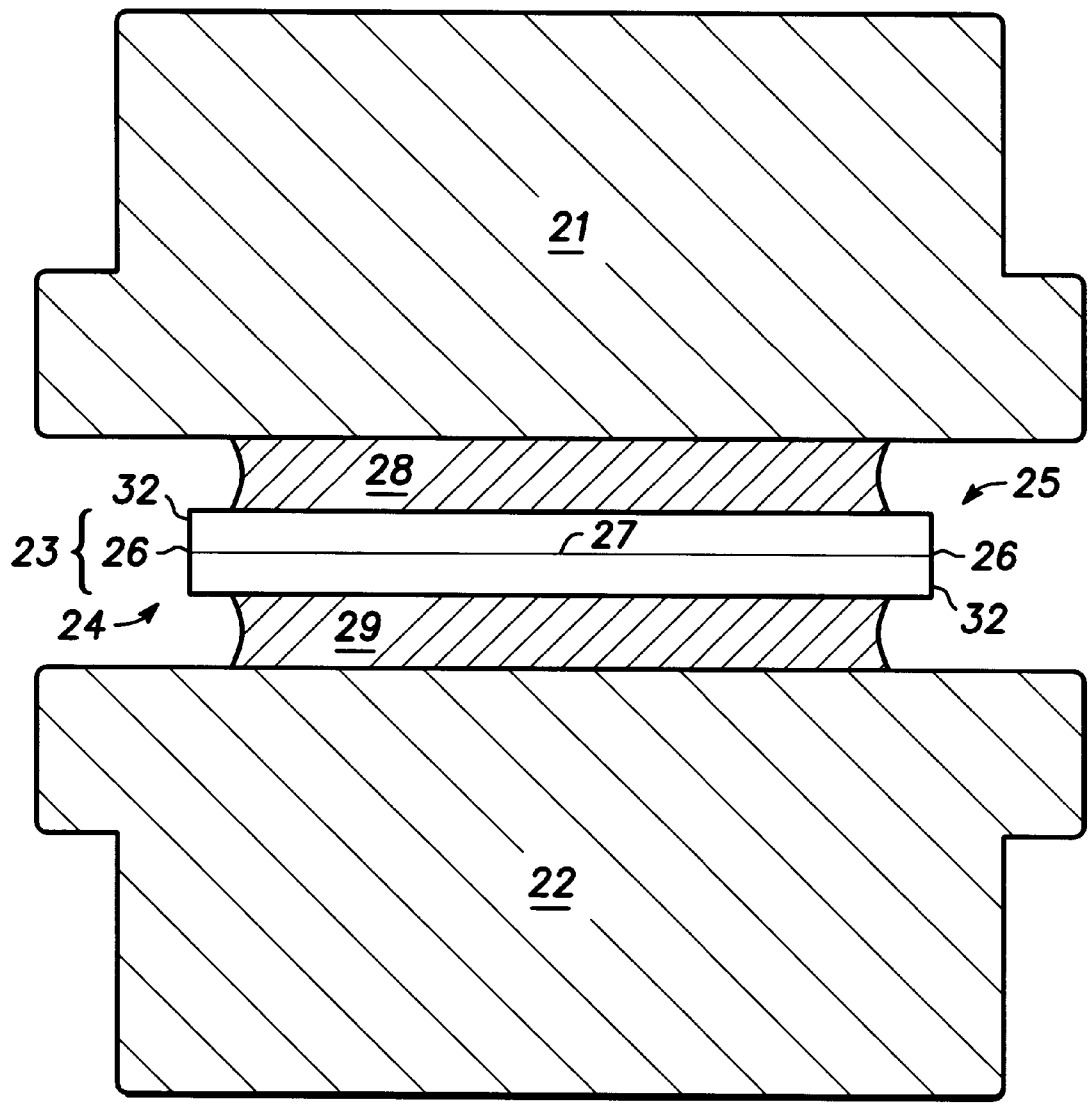
FIG. 2 illustrates a cross-sectional view of an embodiment of a semiconductor assembly before passivation and before packaging in accordance with the present invention.

The semiconductor substrate of step 13 has an open junction as portrayed in the following figure. In particular, FIG. 2 illustrates a cross-sectional view of an embodiment of a semiconductor assembly before passivation and before packaging in accordance with the present invention. A semiconductor substrate of step 13 is represented as a semiconductor die or semiconductor substrate 23 in FIG. 2. Semiconductor substrate 23 contains a p-n junction or junction 27 fabricated during step 12. Heatsinks 21 and 22 and solder 28 and 29 of FIG. 2 are discussed in a later section.

The singulation process of step 13 forms edge surfaces 24 and 25 along semiconductor substrate 23. As explained previously, the mechanical singulation process of step 13 may damage open junction 26 and edge surfaces 24 and 25, and this damaged portion of semiconductor substrate 23 is removed during a subsequent processing step. Edge surfaces 24 and 25 contain an open p-n junction or open junction 26. Accordingly, semiconductor substrate 23 is referred to as an open junction die because junction 27 is exposed or is open along edge surfaces 24 and 25 at a region identified as open junction 26.

Returning to FIG. 1, method 10 proceeds with a step 14, which uses semiconductor substrate 23 to form or assemble a semiconductor component. The semiconductor component of step 14 is portrayed in FIG. 2 as semiconductor diode or semiconductor component 20, which includes heatsinks 21 and 22, solder 28 and 29, and semiconductor substrate 23.

Heatsinks 21 and 22 dissipate heat from semiconductor substrate 23 and also serve as electrical contacts for junction 27 of semiconductor substrate 23. Preferably, heatsinks 21 and 22 are more thermally conductive than semiconductor substrate 23 but have a thermal coefficient of expansion similar to that of semiconductor substrate 23. Heatsinks 21 and 22 are also preferably comprised of or plated with a material that is capable of withstanding a subsequent etch used to remove the regions at open junction 26 and edge surfaces 24 and 25 that were mechanically damaged during the singulation process of step 13.

Accordingly, heatsinks 21 and 22 are preferably comprised of copper and preferably have a nickel plating over the copper. In a preferred embodiment, a cold metal technique such as, for example, stamping or extrusion, is used to configure or shape the copper. However, in an alternative embodiment, heatsinks 21 and 22 are molded or cast into a desired shape using other techniques known in the art.

Then, the nickel is applied to the copper preferably using an electroplating or electroless plating process. In an alternative embodiment, heatsinks 21 and 22 are comprised of any suitable heat conducting and electrically conducting material including, but not limited to, copper without a nickel plating, gold, silver, platinum, and nickel plated aluminum.

Solder 28 and 29 of FIG. 2 is preferably comprised of lead, indium, and silver having an approximate 92.5, 5.0, and 2.5 percent volume by weight, respectively. However, other suitable solder compositions including, but not limited to, silver and tin that are electrically and thermally conductive can be used in an alternative embodiment. In another embodiment of the present invention, a conductive adhesive or a brazing alloy can be used in place of solder 28 and 29.

Step 14 of FIG. 1 forms or builds semiconductor component 20 of FIG. 2 by disposing or positioning solder 29 over heatsink 22. Then, semiconductor substrate 23 is disposed or provided over solder 29, and solder 28 is disposed over semiconductor substrate 23. Finally, heatsink 21 is disposed over solder 29. Therefore, a sandwich assembly structure having heatsink 22, solder 29, semiconductor substrate 23, solder 28, and a heatsink 21 is formed.

In a preferred embodiment where solder 28 and 29 comprises lead, indium, and silver, the sandwich assembly structure is treated in a thermal process to wet solder 28 and 29. Heatsinks 21 and 22, solder 28 and 29, and semiconductor substrate 23 are preferably heated in a belt furnace to a temperature of approximately 300–500 degrees Celsius (° C.) in an atmosphere of nitrogen or hydrogen with nitrogen for approximately 30–60 minutes. It is understood that other times and temperatures can be used during step 14 in accordance with the present invention, especially when solder 28 and 29 is comprised of a mixture other than lead, indium, and silver or when solder 28 and 29 is comprised of a brazing alloy.

After the thermal process of step 14, the sandwich assembly structure is cooled. Step 14 uses solder 28 and 29 and heatsinks 21 and 22 to cover a portion of semiconductor substrate 23 while portion 32 of semiconductor substrate 23 remains exposed. Exposed portion 32 of semiconductor substrate 23 includes edge surfaces 24 and 25 and open junction 26 as portrayed in the illustrated embodiment of FIG. 2.

Exposed portion 32 is etched during a subsequent step 15 while the non-exposed portion, or metal covered portion, of semiconductor substrate 23 is not etched during step 15. Step 15 etches exposed portion 32 to remove the regions of portion 32 that were damaged during the mechanical singulation process of step 13.

As outlined in FIG. 1, step 15 uses an etchant to etch semiconductor substrate 23 of semiconductor component 20 in a, chamber of an etch tool. Preferably, the etch tool of step 15 is a downstream magnetron microwave etch tool such as, for example, etcher model number XPC500 available from Secon Company of Vienna, Austria. A downstream magnetron microwave etch tool uses a magnetron source to generate microwaves in a first area within the etch tool. The microwaves act on a gas to create or generate a plasma for etching a material, and the plasma or the radicals from the plasma are transferred downstream to a second area within the etch tool where the etchable material is located. A downstream etch tool is preferred because the energy used to create the plasma can damage semiconductor material. Therefore, it is preferred to generate the plasma in one location within the etch tool and to etch the semiconductor material in another location within the etch tool. However, other sources such as, a radio frequency (rf) source, can also be used to generate the dry etch plasma radicals.

Step 15 of method 10 begins by loading semiconductor component 20 into a chamber within the previously described etch tool. Then, the chamber or etch chamber is preferably purged with an inert or non-reactive gas such as, for example, nitrogen or argon. Afterwards, the non-reactive gas is preferably pumped out of the chamber, and the chamber is preferably held under vacuum.

Next, a plasma is created from a carbon tetrafluoride gas ($CF_4$) and a nitrous oxide gas ($N_2O$) by using the magnetron microwave plasma generator in a preferred embodiment. Subsequently, the plasma radicals are transferred downstream to etch semiconductor substrate 23 of semiconductor component 20. It is understood that other etchants such as sulfur hexafluoride ($SF_6$) can also be used to create the plasma. However, the plasma should preferentially etch semiconductor substrate 23 versus heatsinks 21 and 22 and solder 28 and 29. Therefore, the specific chemicals or gases used to create the plasma are dependent upon the composition of heatsinks 21 and 22, solder 28 and 29, and semiconductor substrate 23. Different gases or etchants can be used in accordance with the present invention if different materials are used for heatsinks 21 and 22, solder 28 and 29, and semiconductor substrate 23.

In a preferred embodiment, where the XPC500 etch tool is used, a mass flow controller is used to provide $CF_4$ into the etch tool at a rate of approximately 900–1,000 serial cubic centimeters per minute (sccm), and another mass flow controller is used to provide $N_2O$ into the etch tool at a rate of approximately 400–650 sccm. The etching of exposed portion 32 of semiconductor substrate 23 is preferably performed in the etch tool at a temperature near ambient or approximately 20–50 ° C. and is also preferably performed at a pressure below ambient or approximately 0.1–10 millibar (mBar).

After step 15 of method 10, a step 16 of the present invention purges the chamber of the etch tool. In a preferred embodiment, an inert or non-reactive gas such as, for example, nitrogen or argon is used to purge the chamber. Then, the non-reactive gas is preferably pumped out of the chamber. Step 16 is used to remove the particulates from within the chamber. In an embodiment where semiconductor substrate 23 is comprised of silicon, step 15 generates silicon dust or silicon particles within the etch chamber of the etch tool. Therefore, step 16 is used to remove the particulates prior to passivating semiconductor substrate 23 in a step 17 of method 10. Step 16 is used in the present invention because it is undesirable to trap particulates or contamination within a passivation layer.

Method 10 of FIG. 1 continues with a step 17, which passivates exposed portion 32 of semiconductor substrate 23 in the chamber of the etch tool. In a preferred embodiment, semiconductor component 20 is kept within the chamber of the etch tool from step 15 through step 17 in order to prevent exposed portion 32 of semiconductor substrate 23 from being contaminated. If semiconductor component 20 is introduced into ambient immediately after the etch of step 15, exposed portion 32 of semiconductor substrate 23 can be contaminated before a protective passivation layer can be provided. Therefore, semiconductor component 20 is preferably not removed from the chamber of the etch tool until after step 17.

Exposed portion 32 is preferably passivated by using plasma radicals generated from an $N_2O$ gas, but other suitable gases containing oxygen can also be used. In a preferred embodiment where an XPC500 etch tool is used, a mass flow controller is used to provide $N_2O$ gas into the etch tool at a rate of approximately 200–300 sccm. In an embodiment where $N_2O$ and $CF_4$ are used to etch semiconductor substrate 23 in step 15, the same source of $N_2O$ can be used to supply $N_2O$ for step 17 of method 10. The passivation of exposed portion 32 of semiconductor substrate 23 within the XPC500 etch tool is preferably performed at a pressure below ambient or approximately 0.1–10 mBar and is also preferably performed at a temperature near ambient or approximately 20–50° C.

As the $N_2O$ gas is introduced in a controlled manner through the mass flow controller and into the etch tool, the nitrous oxide is disassociated into free radicals of nitrogen and oxygen, preferably by the aforementioned magnetron microwave plasma generator. The free radicals are then preferably transported downstream to semiconductor component 20. The oxygen radicals impinge upon and react with exposed portion 32 of semiconductor substrate 23 and form a passivation layer comprised of silicon oxide.

Figure 3:
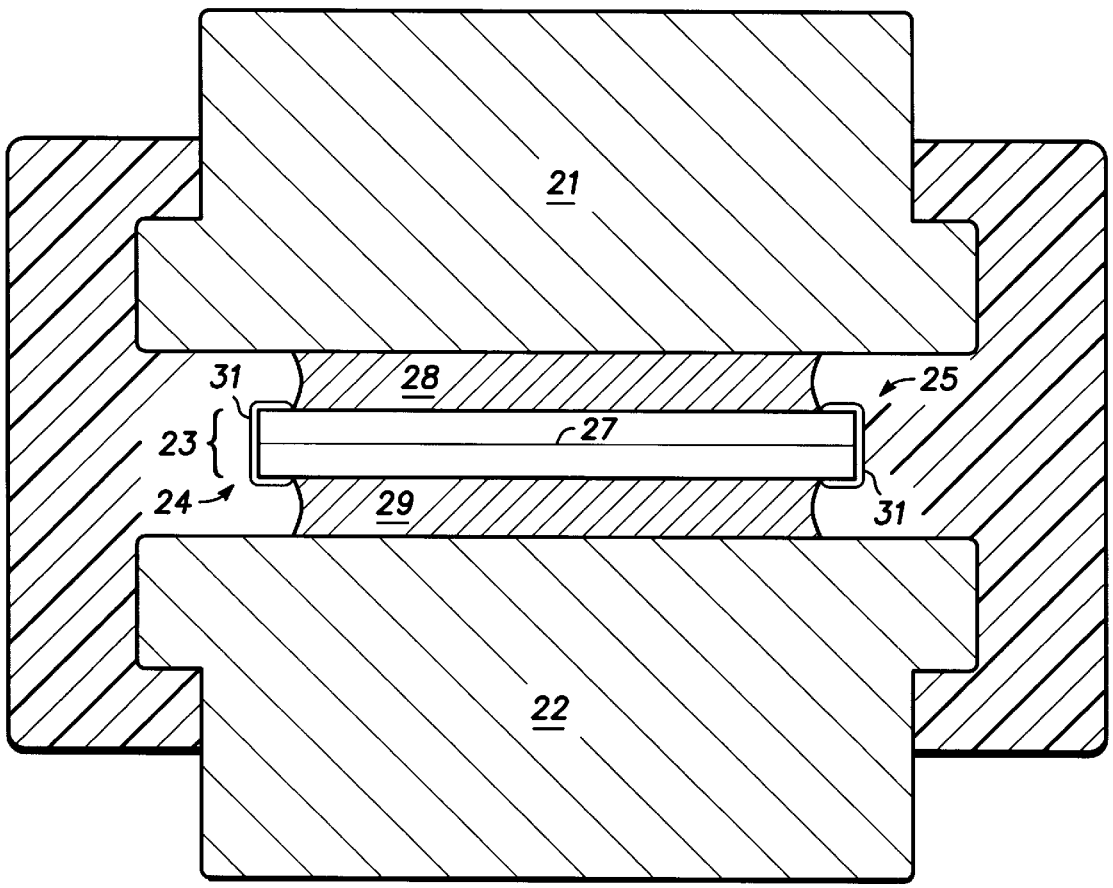
FIG. 3 illustrates a cross-sectional view of an embodiment of the semiconductor assembly after passivation and after packaging in accordance with the present invention.

The passivation layer formed during step 17 of method 10 is depicted in FIG. 3 in accordance with the present invention and is represented by a passivation layer, oxide coating, or oxide layer 31. Oxide layer 31 overlies or covers exposed portion 32 of semiconductor substrate 23. In particular, oxide layer 31 covers or protects open junction 26 of edge surfaces 24 and 25. Oxide layer 31 preserves and protects open junction 26 from the external environment that may contain conductive ionic contamination. Therefore, oxide layer 31 provides an effective barrier against the contamination of open junction 26. In one embodiment of the present invention, oxide layer 31 is preferably less than approximately 100 angstroms (Å) thick. In the illustrated embodiment of FIG. 3, oxide layer 31 is preferably less than approximately 20 Å thick.

Oxide layer 31 is preferably a portion of semiconductor substrate 23, rather than a layer that simply overlies or is deposited upon semiconductor substrate 23. In step 17, a portion of semiconductor substrate 23 is preferably oxidized to form oxide layer 31. Accordingly, in a preferred embodiment of the present invention, oxide layer 31 is mechanically robust.

It is understood that step 17 of method 10 does not deposit on or substantially affect heatsinks 21 or 22 or solder 28 or 29 because the oxygen radicals in the plasma do not substantially react with the metallic heatsinks or solder. In a preferred embodiment, the oxygen radicals of step 17 only substantially react with the silicon atoms of semiconductor substrate 23.

Returning to FIG. 1, method 10 continues with a step 18, which packages or encapsulates the semiconductor substrate. As illustrated in FIG. 3, a packaging material 30 is molded around portions of heatsinks 21 and 22, solder 28, and semiconductor substrate 23. In a preferred embodiment, packaging material 30 is HYSOL™ MG40F available from Dexter Corporation of Olean, N.Y. However, in an alternative embodiment, any appropriate encapsulant is used for packaging material 30 in accordance with the present invention.

In a preferred embodiment where packaging material 30 comprises HYSOL™ MG40F, packaging material 30 is molded at a temperature of approximately 110–175° C. and at a pressure of approximately 30–75 bars. Packaging material 30 is then preferably cured to cross-link the compound at a temperature of approximately 150–175° C. for approximately 2–5 minutes. It is understood that the molding and curing times and temperatures can vary from those listed above, especially when an encapsulant other than HYSOL™ G40F is used.

The present invention is more cost effective and is less time consuming than a prior art method, known as glass passivation, that passivates the open junction die prior to coupling heatsinks or electrodes to the open junction die. In this glass passivation method, a portion of the passivation layer must be removed from the open junction die so that the electrodes can be coupled to the open junction die. However, this partial removal of the passivation layer requires an extra etch step, which increases the cost and cycle time of the prior art method.

The present invention is also more cost effective and less time consuming than a second prior art method, which deposits a passivation layer over the open junction die, solder, and heatsinks or electrodes. Similar to the glass passivation method, an extra etch step must be used to remove a portion of the passivation layer from the electrodes in order to couple the electrodes to other electronic components.

Furthermore, in this second prior art method, the semiconductor substrate is exposed to ambient after the etching step is used to remove the damaged portions of the semiconductor substrate and before the passivation layer is deposited. Therefore, the semiconductor substrate of the prior art will be contaminated prior to the deposition of the passivation layer in the second prior art method.

However, in the present invention, oxide layer or passivation layer 31 is provided or formed in-situ. In other words, in-situ passivation layer 31 is formed after the etching process of step 15 and before semiconductor substrate 23 is exposed to ambient.

While the invention has been particularly shown and described with reference to preferred embodiments, it will be understood by those skilled in the art that changes in form and detail may be made without departing from the spirit and scope of the invention. For instance, the etch chamber purging of step 16 can alternatively use the nitrous oxide gas used in the etching of step 15 to purge the etch chamber. However, in this alternative embodiment, the magnetron microwave plasma generator should be turned off during step 16 so that silicon dust particles generated during the etching of step 15 are not trapped in the subsequently formed passivation layer. In other words, this alternative process would first complete the etching of step 15 using nitrous oxide and carbon tetrafluoride, discontinue the use of the carbon tetrafluoride, turn off the magnetron microwave plasma generator, purge the etch chamber with the nitrous oxide, and then begin the passivation of step 17 using the nitrous oxide.

As additional example of an alternative embodiment of the present invention, the passivation of step 17 is accomplished by subjecting semiconductor substrate 23 to a thermal process and an atmosphere containing oxygen. In this alternative embodiment, a thermal oxide is grown over exposed portion 32, and a plasma generator would not be required for step 17.

Therefore, in accordance with the present invention, it is apparent there has been provided an improved method of passivating a semiconductor substrate that overcomes the disadvantages of the prior art. The present invention eliminates the excess cycle time and cost of the prior art methods and also reduces the potential of contaminating an open junction die.

We claim:

1. A method of passivating a semiconductor substrate, the method comprising the steps of:
    covering a first portion of the semiconductor substrate with an electrode, a second portion of the semiconductor substrate remaining exposed;
    etching the second portion of the semiconductor substrate with an etchant after the covering step; and
    providing an in-situ passivation layer over the second portion of the semiconductor substrate after the step of etching the second portion of the semiconductor substrate.

2. The method according to claim 1, wherein the step of providing the in-situ passivation layer includes heating the semiconductor substrate in an atmosphere comprising oxygen.

3. The method according to claim 1, further comprising the step of using a downstream etch tool for the etching and providing steps.

4. The method according to claim 3, further comprising:
    retaining the semiconductor substrate and the electrode in the downstream etch tool between the step of etching the second portion of the semiconductor substrate and the step of providing the in-situ passivation layer; and
    preventing the semiconductor substrate from being exposed to ambient between the step of etching the second portion of the semiconductor substrate and the step of providing the in-situ passivation layer.

5. The method according to claim 3, wherein the step of providing the in-situ passivation layer includes using a plasma containing oxygen.

6. The method according to claim 1, wherein the step of etching the second portion of the semiconductor substrate includes leaving the electrode substantially unetched.

7. The method according to claim 1, wherein the step of providing the in-situ passivation layer over the second portion of the semiconductor substrate includes leaving the electrode substantially unpassivated.

8. The method according to claim 1, further comprising the step of fabricating a junction in the semiconductor substrate prior to the step of covering the first portion of the semiconductor substrate with the electrode, wherein the second portion of the semiconductor substrate includes an open junction.

9. The method according to claim 1, further comprising the step of encapsulating the semiconductor substrate after the step of providing the in-situ passivation layer.

10. A method of fabricating a semiconductor component, the method comprising the steps of:
    singulating a first semiconductor substrate from a second semiconductor substrate, wherein singulating the first semiconductor substrate forms an edge surface on the first semiconductor substrate;
    dry etching the edge surface of the first semiconductor substrate; and
    thereafter, disposing a passivation layer over the edge surface of the first semiconductor substrate.

11. The method according to claim 10, wherein the step of disposing a passivation layer includes providing nitrous oxide in the chamber.

12. The method according to claim 10, further including the step of generating a plasma from carbon tetrafluoride and nitrous oxide, wherein the dry etching step includes using the plasma to dry etch the edge surface of the first semiconductor substrate in the chamber.

13. The method according to claim 12, wherein the generating step and the dry etching step include using a downstream etch tool.

14. The method according to claim 10, further including the step of fabricating a junction in the second semiconductor substrate, wherein the step of singulating the first semiconductor substrate includes providing the junction in the first semiconductor substrate, wherein the junction is exposed along the edge surface of the first semiconductor substrate.

15. A method of manufacturing a semiconductor component, the method comprising the steps of:
    fabricating a p-n junction in a semiconductor substrate;
    separating a semiconductor die from the semiconductor substrate, the semiconductor die containing the p-n junction, a portion of the p-n junction being open;
    coupling a first heatsink and a second heatsink to the semiconductor die, the first heatsink covering a first portion of the semiconductor die, the second heatsink covering a second portion of the semiconductor die, and a third portion of the semiconductor die remaining exposed;
    dry etching the third portion of the semiconductor die; and
    subsequently, passivating the third portion of the semiconductor die.

16. The method according to claim 15, wherein the steps of dry etching and passivating the third portion of the semiconductor die include using a magnetron microwave etch tool.

17. The method according to claim 16, further comprising the steps of:
    keeping the semiconductor die in the magnetron microwave etch tool between the steps of dry etching and passivating the third portion of the semiconductor die; and
    purging the magnetron microwave etch tool with a non-reactive gas after the step of dry etching the third portion of the semiconductor die and before the step of passivating the third portion of the semiconductor die.

18. The method according to claim 15, wherein the steps of dry etching and passivating the third portion of the semiconductor die include using nitrous oxide.

19. The method according to claim 18, wherein the step of passivating the third portion of the semiconductor die includes providing an oxide layer over the third portion of the semiconductor die.

20. The method according to claim 15, wherein the step of passivating the third portion of the semiconductor die includes oxidizing the third portion of the semiconductor die by exposing the third portion of the semiconductor die to oxygen radicals.

21. The method according to claim 1 wherein the covering step includes using solder to couple the electrode to the first portion of the semiconductor substrate.

22. The method according to claim 21 further comprising forming a p-n junction in the semiconductor substrate before the covering step wherein the etching step etches a portion of the p-n junction.

23. The method according to claim 22 further comprising singulating the semiconductor substrate from a semiconductor wafer after the forming step and before the covering step wherein the singulating step exposes the second portion of the semiconductor substrate.

24. The method according to claim 23 wherein the forming step includes diffusing dopant into the first portion of the semiconductor substrate to form the p-n junction wherein the second portion of the semiconductor substrate is adjacent to and non-parallel to the first portion of the semiconductor substrate.

25. The method according to claim 24 wherein the covering step includes providing a metal electrode for the electrode.

26. The method according to claim 14 wherein the step of fabricating the junction in the second semiconductor substrate occurs before the singulating step.

27. The method according to claim 26 wherein the step of fabricating the junction includes fabricating a p-n junction by diffusing a dopant into a top surface of the first and second semiconductor substrates wherein the edge surface is adjacent to and non-coplanar with the top surface.

28. The method according to claim 27 further comprising coupling a heatsink to the top surface of the first semiconductor substrate after the singulating step and before the dry etching step.

29. The method according to claim 15 wherein the separating step includes forming a side surface on the semiconductor die wherein a portion of the p-n junction is exposed along the side surface.

30. The method according to claim 29 wherein the coupling step comprises:
    providing a first metal heatsink for the first heatsink; and
    providing a second metal heatsink for the second heatsink.

31. The method according to claim 30 wherein the coupling step further comprises:
    providing the first portion of the semiconductor die along a top surface of the semiconductor die;

providing the second portion of the semiconductor die along a bottom surface of the semiconductor die; and providing the third portion of the semiconductor die along a side surface of the semiconductor die, wherein the top surface is opposite the bottom surface, and wherein the side surface couples the top and bottom surfaces.

32. The method according to claim 30 further comprising using solder to couple the first and second heatsinks to the semiconductor die.

33. The method according to claim 15 wherein the dry etching step occurs after the coupling step and wherein the passivating step occurs after the dry etching step.

34. The method according to claim 17 wherein the keeping step includes preventing the semiconductor die from being exposed to ambient between the dry etching step and the passivating step.

* * * * *